(12) United States Patent
Ohshima et al.

(10) Patent No.: US 12,165,828 B2
(45) Date of Patent: Dec. 10, 2024

(54) ELECTRON GUN AND ELECTRON BEAM APPLICATION APPARATUS

(71) Applicant: Hitachi High-Tech Corporation, Tokyo (JP)

(72) Inventors: Takashi Ohshima, Tokyo (JP); Hideo Morishita, Tokyo (JP); Tatsuro Ide, Tokyo (JP); Naohiro Kohmu, Tokyo (JP); Momoyo Enyama, Tokyo (JP); Yoichi Ose, Tokyo (JP); Toshihide Agemura, Tokyo (JP); Junichi Katane, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/768,244

(22) PCT Filed: Oct. 31, 2019

(86) PCT No.: PCT/JP2019/042781
§ 371 (c)(1),
(2) Date: Apr. 12, 2022

(87) PCT Pub. No.: WO2021/084684
PCT Pub. Date: May 6, 2021

(65) Prior Publication Data
US 2024/0120168 A1  Apr. 11, 2024

(51) Int. Cl.
*H01J 37/073* (2006.01)
*H01J 1/34* (2006.01)
(Continued)

(52) U.S. Cl.
CPC .............. *H01J 37/073* (2013.01); *H01J 1/34* (2013.01); *H01J 37/1474* (2013.01);
(Continued)

(58) Field of Classification Search
CPC ........ H01J 37/073; H01J 1/34; H01J 37/1474; H01J 37/22; H01J 37/265; H01J 37/285; H01J 2237/06333
See application file for complete search history.

(56) References Cited

U.S. PATENT DOCUMENTS 5,684,360 A    11/1997  Baum et al.
5,932,966 A *   8/1999  Schneider ............. H01J 37/075
                                                    313/530
(Continued)

FOREIGN PATENT DOCUMENTS

JP    H11509360 A    8/1999
JP    2000123716 A   4/2000
(Continued)

OTHER PUBLICATIONS

Search Report mailed Jan. 21, 2020 in International Application No. PCT/JP2019/042781.
(Continued)

*Primary Examiner* — David E Smith
*Assistant Examiner* — Christopher J Gassen
(74) *Attorney, Agent, or Firm* — Miles & Stockbridge, P.C.

(57) ABSTRACT

An electron beam emitted from a photoexcited electron gun is increased in luminance. An electron gun 15 includes: a photocathode 1 including a substrate 11 and a photoelectric film 10; a light source 7 that emits pulsed excitation light; a condenser lens 2 that focuses the pulsed excitation light toward the photocathode; and an extractor electrode 3 that faces the photocathode and that accelerates an electron beam generated from the photoelectric film by focusing the pulsed excitation light by the condenser lens, transmitting the pulsed excitation light through the substrate of the photocathode, and causing the pulsed excitation light to be incident on the photocathode. The pulsed excitation light is condensed at different timings at different positions on the photoelectric film of the photocathode.

11 Claims, 8 Drawing Sheets

(51) Int. Cl.
  *H01J 37/147* (2006.01)
  *H01J 37/22* (2006.01)
  *H01J 37/26* (2006.01)
  *H01J 37/285* (2006.01)

(52) U.S. Cl.
  CPC ............ *H01J 37/22* (2013.01); *H01J 37/265* (2013.01); *H01J 37/285* (2013.01); *H01J 2237/06333* (2013.01)

(56) References Cited

U.S. PATENT DOCUMENTS

| | | | | |
|---|---|---|---|---|
| 6,005,247 | A | * 12/1999 | Baum | .................. H01J 37/073 250/397 |
| 6,828,574 | B1 | 12/2004 | Allen | |
| 9,269,527 | B2 | * 2/2016 | Reed | ..................... H01J 37/265 |
| 2011/0089397 | A1 | 4/2011 | Ujihara et al. | |
| 2019/0088441 | A1 | 3/2019 | Suyama et al. | |
| 2020/0080949 | A1 | * 3/2020 | Nishitani | .............. G01N 23/203 |
| 2021/0375578 | A1 | * 12/2021 | Watanabe | ................ H01J 3/021 |

FOREIGN PATENT DOCUMENTS

| | | |
|---|---|---|
| JP | 2001143648 A | 5/2001 |
| JP | 2004506296 A | 2/2004 |
| JP | 2009266809 A | 11/2009 |
| JP | 2019057387 A | 4/2019 |

OTHER PUBLICATIONS

Written Opinion mailed Jan. 21, 2020 in International Application No. PCT/JP2019/042781.

Makoto Kuwahara et al., "Coherence of a spin-polarized electron beam emitted from a semiconductor photocathode in a transmission electron microscope" Applied Physics Letters, vol. 105, 2014, pp. 1-5.

* cited by examiner

[FIG. 1A]
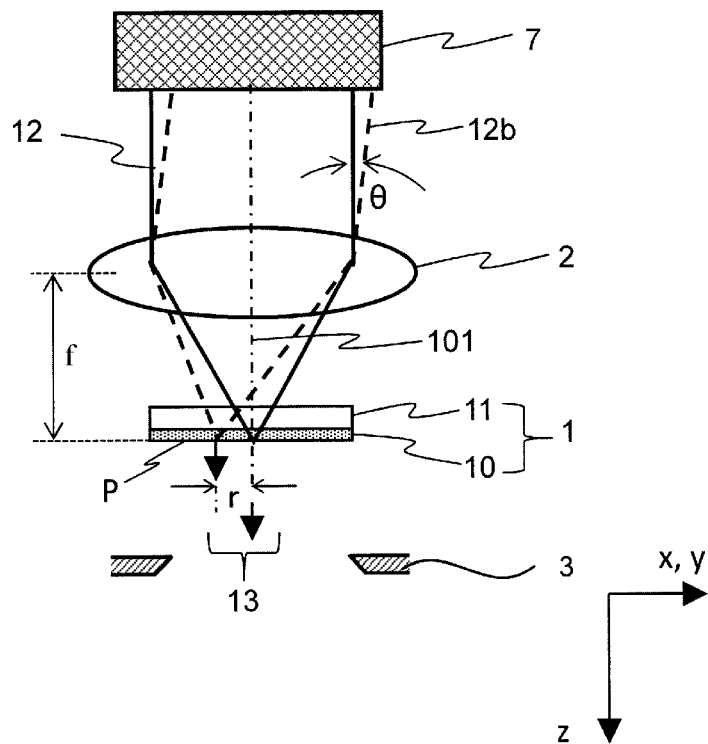
[FIG. 1B]
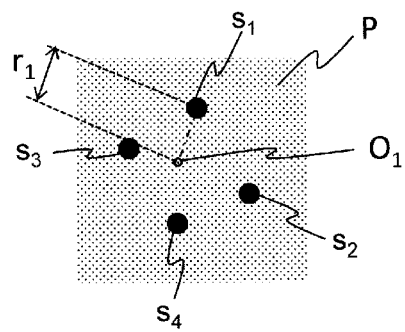

[FIG. 2A]
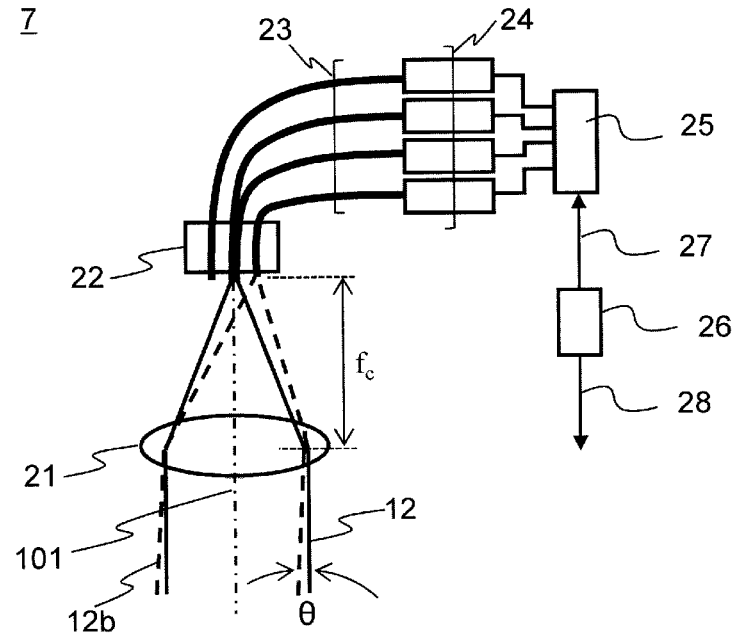
[FIG. 2B]
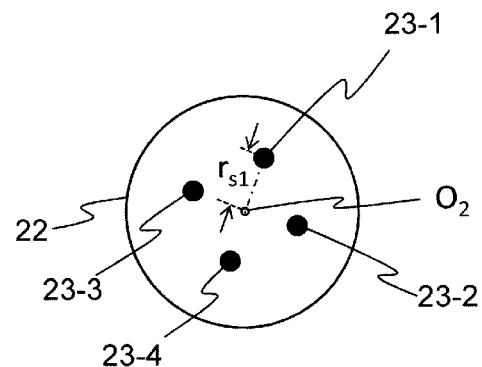

[FIG. 2C]
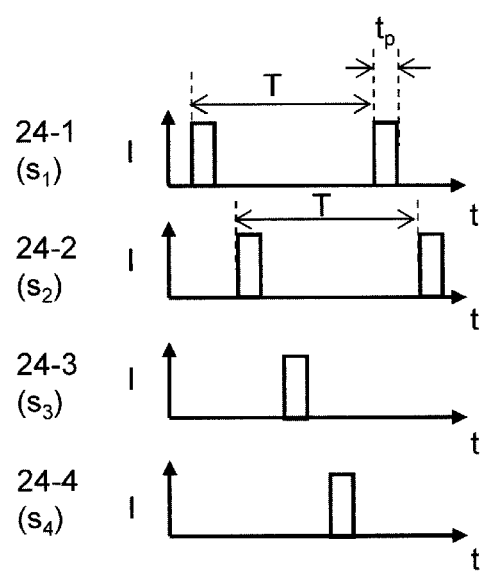

[FIG. 3]
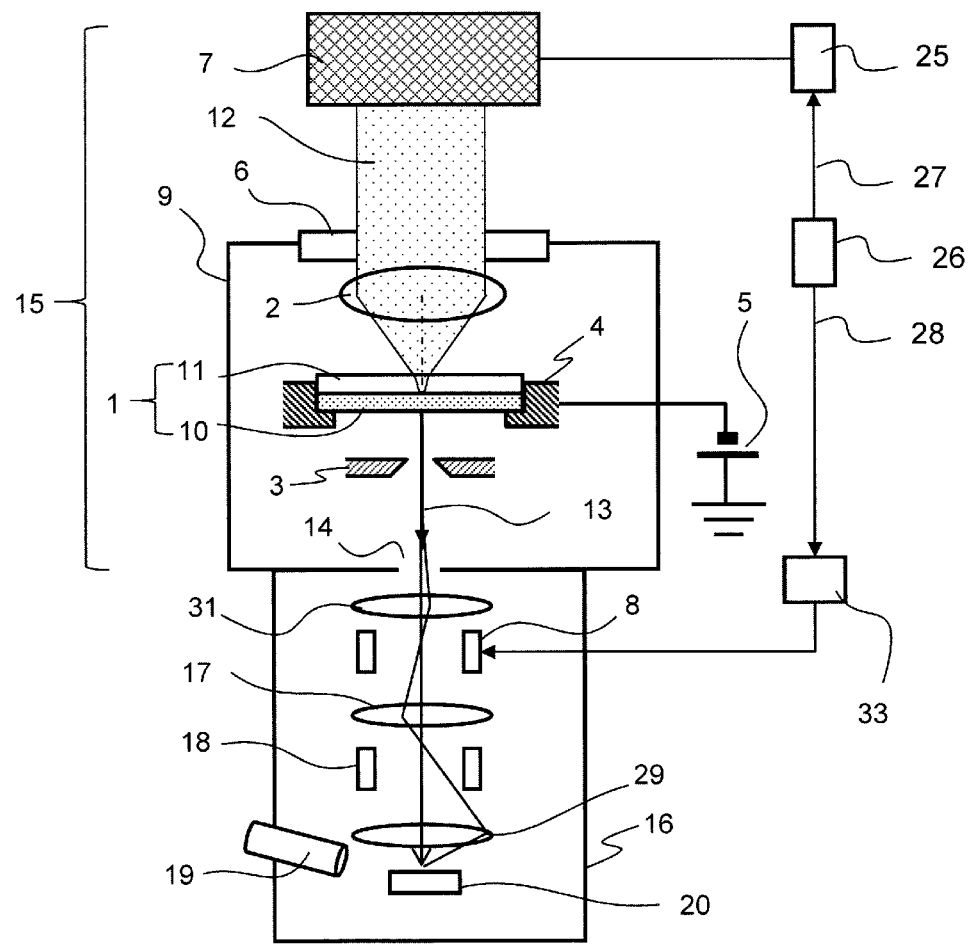

[FIG. 4A]
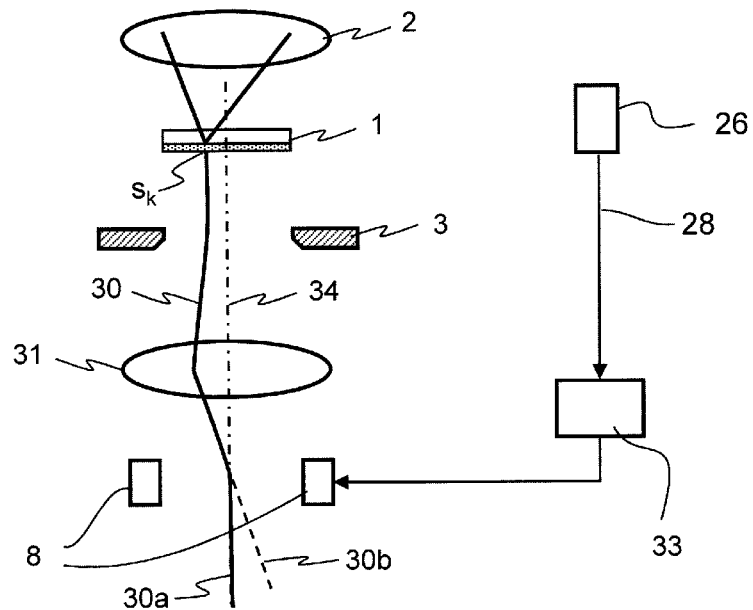
[FIG. 4B]
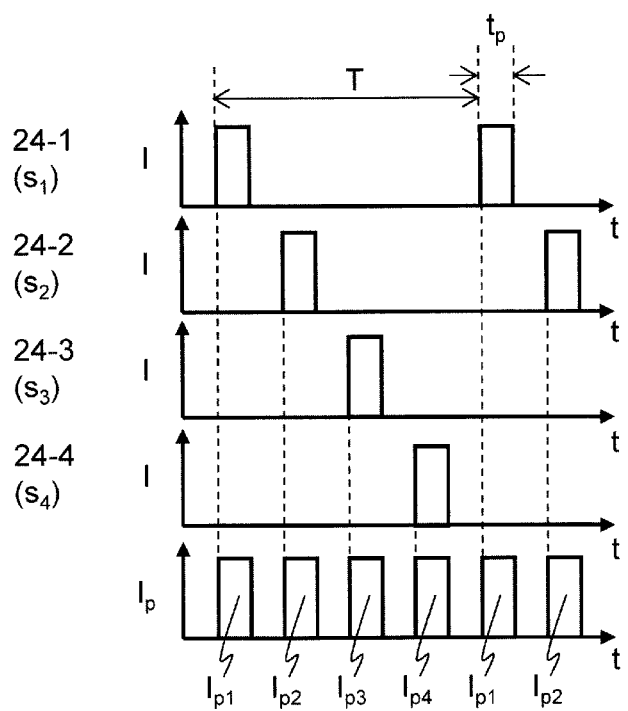

[FIG. 5]
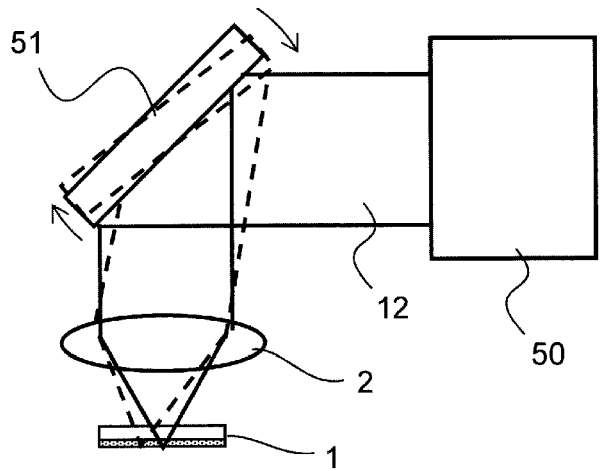
[FIG. 6]
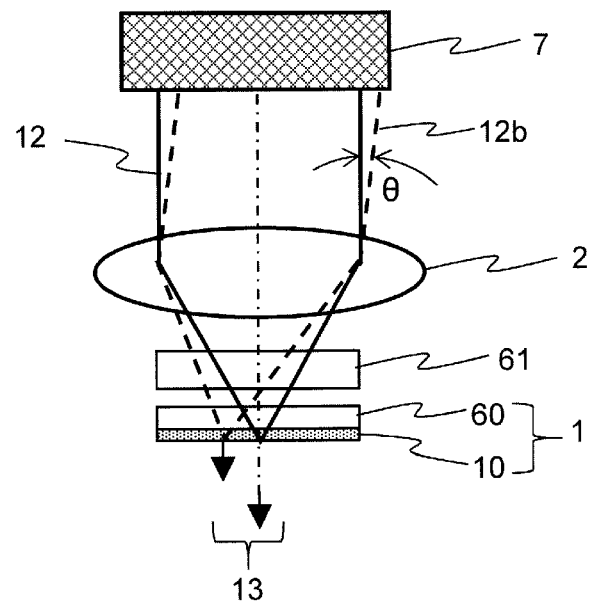

[FIG. 7A]
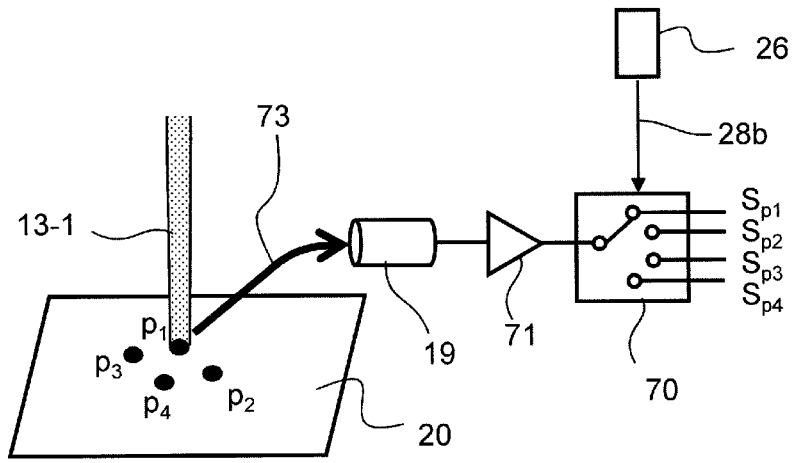
[FIG. 7B]
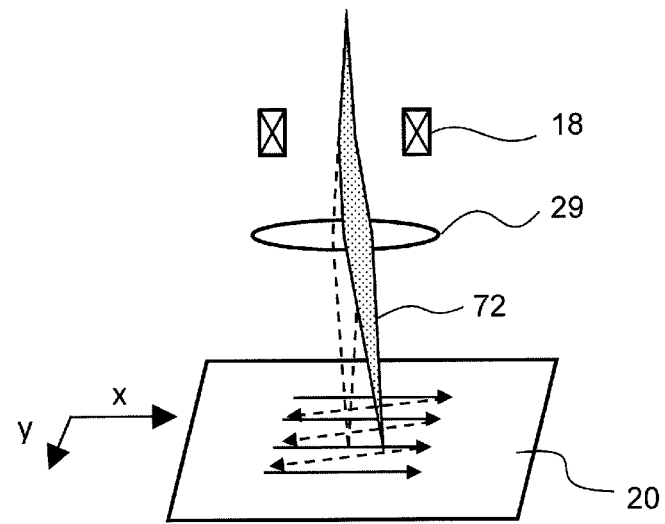

[FIG. 7C]
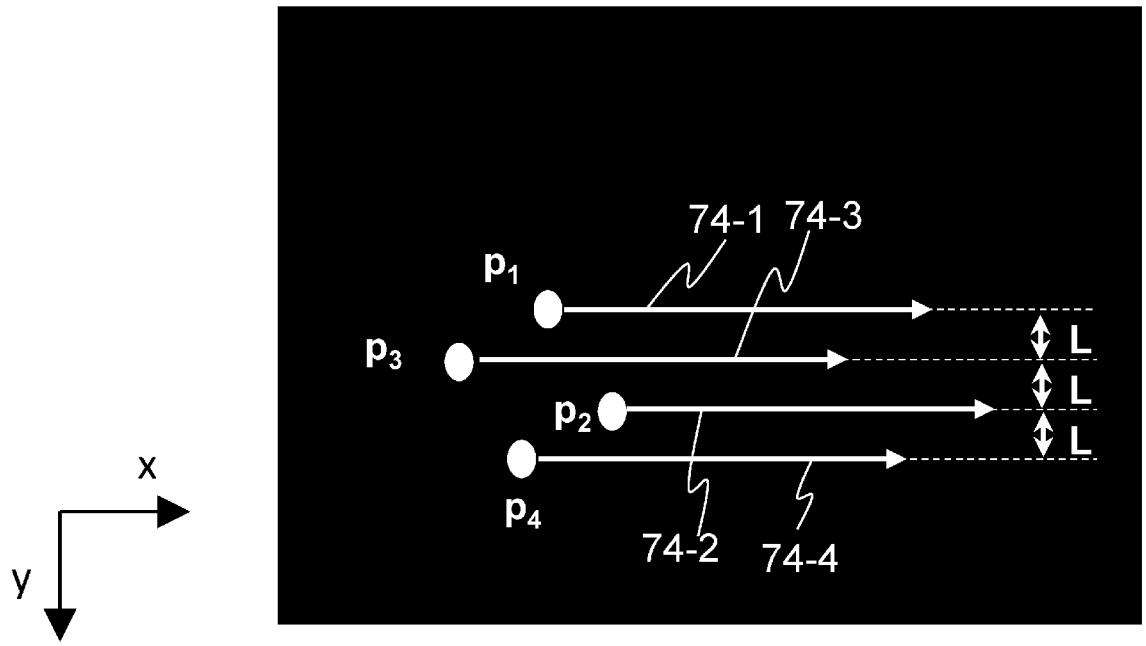
[FIG. 7D]
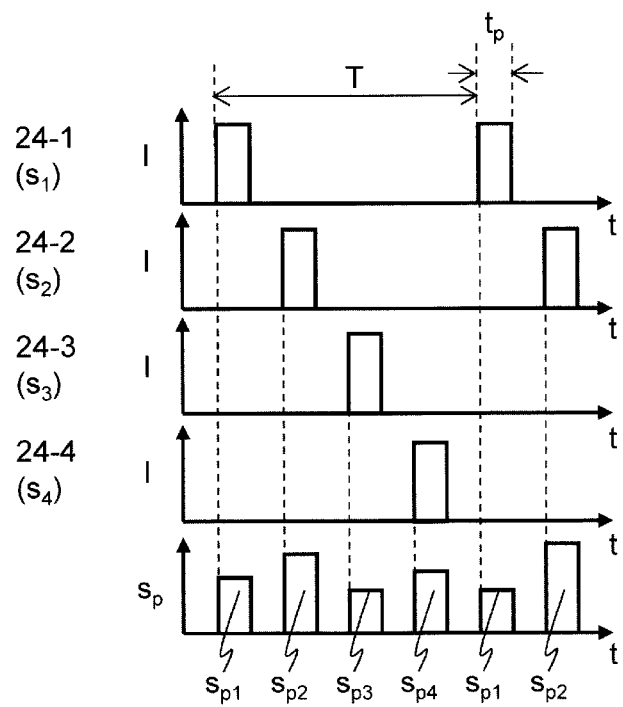

ELECTRON GUN AND ELECTRON BEAM APPLICATION APPARATUS

TECHNICAL FIELD

The present invention relates to a photoexcited electron gun and an electron beam application apparatus such as an electron microscope using the photoexcited electron gun.

BACKGROUND ART

In a high-resolution electron microscope, an electron source having a high luminance and a narrow energy width of an electron beam to be emitted is essential. In related arts, a cold field emission (CFE) electron source or a Schottky emission (SE) electron source has been used as a high-luminance electron source. These electron sources have a needle shape with a small distal end, and a virtual light source size is several nm to several tens of nm. On the other hand, a photoexcited electron source using negative electron affinity (NEA) has an extremely narrow energy width, but is a planar electron source, and a focal size of excitation light, which is a light source size, is as large as approximately 1 μm. However, since straightness of electrons emitted from the photoexcited electron source is good, high brightness is expected by increasing a current density.

PTL 1 discloses a photoexcited electron source. An electron gun structure is disclosed. In the electron gun structure, a transparent substrate, specifically, a substrate obtained by attaching a photocathode film (photoelectric film) on a glass is used as a photocathode, excitation light is converged in a diffraction limit on the photoelectric film by a condenser lens that has a numerical aperture (NA) of approximately 0.5 and that is placed close to the transparent substrate to form a small electron light source, and an electron beam emitted from the electron source into vacuum is used. As a photocathode suitable for high brightness, in recent years, as disclosed in PTL 2, a semiconductor photocathode is developed in which a photocathode layer is formed on a semiconductor substrate using a semiconductor crystal growth technique. As shown in Non-PTL 1, the semiconductor photocathode has a luminance comparable to that of the Schottky electron source.

PTL 3 discloses a micro electron source that emits multiple electron beams by condensing laser light emitted from a two-dimensional laser array on an NEA photocathode by a planographic microlens array. However, there is no description relating to increasing a luminance of a micro electron source necessary for application to a high-resolution electron microscope.

PTL 4 discloses that, in multiple electron beam lithography for speeding up electron beam lithography, ultraviolet light from an ultraviolet light source is modulated by a spatial light modulator and guided to an optical cathode, thereby generating a multiple focused electron beam.

CITATION LIST

Patent Literature

PTL 1: JP-A-2001-143648
PTL 2: JP-A-2009-266809
PTL 3: JP-A-2000-123716
PTL 4: JP-T-2004-506296

Non-Patent Literature

Non-Patent Literature 1: Kuwahara and others, "Coherence of a spin-polarized electron beam emitted from a semiconductor photocathode in a transmission electron microscope" Applied Physics Letters, Vol. 105, p. 193101, 2014

SUMMARY OF INVENTION

Technical Problem

In order to achieve a high resolution comparable to that of a CFE electron source with an electron microscope using a photoexcited electron gun, it is necessary to further increase the luminance of the photoexcited electron gun. However, even if an intensity of the excitation light with which the photocathode is irradiated is increased, the probe current obtained from the electron source (NEA electron source) formed on the photocathode is saturated from the middle, and there is an upper limit in the luminance at which the emission current is obtained.

Solution to Problem

An electron gun according to an embodiment of the invention includes: a photocathode including a substrate and a photoelectric film; a light source that emits pulsed excitation light; a condenser lens that focuses the pulsed excitation light toward the photocathode; and an extractor electrode that faces the photocathode and that accelerates an electron beam generated from the photoelectric film by focusing the pulsed excitation light by the condenser lens, transmitting the pulsed excitation light through the substrate of the photocathode, and causing the pulsed excitation light to be incident on the photocathode. The pulsed excitation light is condensed at different timings at different positions on the photoelectric film of the photocathode.

An electron beam application apparatus is implemented using a photoexcited electron gun that emits a pulsed electron beam at different timings from different positions of a photocathode.

Advantageous Effect

A photoexcited electron gun having a high luminance and an electron beam application apparatus using the photoexcited electron gun are implemented.

Other technical problems and novel characteristics will be apparent based on a description of the present specification and the accompanying drawings.

BRIEF DESCRIPTION OF DRAWINGS

FIG. 1A is a configuration diagram of a photoexcited electron gun.

FIG. 1B is a diagram showing a position of an electron source formed on a cathode surface.

FIG. 2A is a diagram showing a configuration example of a parallel light source having an angle modulation mechanism.

FIG. 2B is a view showing a position of a fiber end fixed to a bundle.

FIG. 2C is a time chart of light emission performed by a laser light source.

FIG. 3 is a schematic configuration diagram showing a first electron microscope configuration.

FIG. 4A is a diagram showing an electron optical system having the first electron microscope configuration.

FIG. 4B is a diagram showing a magnitude of a probe current generated by a pulsed electron beam.

FIG. 5 is a diagram showing another configuration example of the angle modulation mechanism.

FIG. 6 is a configuration diagram of the photoexcited electron gun.

FIG. 7A is a diagram showing a signal detection method in a second electron microscope configuration.

FIG. 7B is a diagram showing a scan method in the second electron microscope configuration.

FIG. 7C is a diagram showing a relationship between a scanning direction and a position irradiated with the pulsed electron beam in the second electron microscope configuration.

FIG. 7D is a diagram showing a magnitude of a detection signal for each pulsed electron beam.

DESCRIPTION OF EMBODIMENTS

Hereinafter, description will be made according to an embodiment.

FIG. 1A shows a configuration of a photoexcited electron gun that forms a plurality of electron sources. Pulsed excitation light 12 from a parallel light source 7 is converged by a condenser lens 2 and emitted to a photoelectric film 10 supported by a transparent substrate 11. When a direction of the pulsed excitation light 12 (solid line) is parallel to a central axis 101 of an excitation light converging optical system, a pulsed electron beam 13 is emitted from a point of the central axis 101 on the photoelectric film 10. The parallel light source 7, which is an excitation light source, has an angle modulation mechanism, and can change an angle at which the excitation light is emitted. When the parallel light source 7 generates inclined pulsed excitation light 12b (broken line), the pulsed excitation light 12b is subjected to an action of the condenser lens 2, and focuses on a position on the photoelectric film 10 away from the central axis 101. When a distance between a focal point and the central axis is r, and an angle between a direction of the inclined pulsed excitation light 12b and the central axis 101 is θ, the following relationship is satisfied.

$$r = f \cdot \tan \theta \quad \text{(Equation 1)}$$

Here, f is a focal length of the condenser lens 2. As described above, a distance r from the central axis of the electron source can be determined by the inclination θ of the excitation light. Since the inclination θ is an inclination in the three-dimensional space, when a direction of the central axis 101 is a z axis and an xy plane defined by an x axis and a y axis is a plane perpendicular to the z axis, the distance r and the inclination θ can be expressed as vectors $(r_x, r_y)$ and $(\theta_x, \theta_y)$ having an x-axis direction component and a y-axis direction component, respectively.

As shown in FIG. 1B, the parallel light source 7 emits the pulsed excitation light 12b while changing the inclination θ, so that a plurality of electron sources $s_1$, $s_2$, $s_3$, and $s_4$ are formed on a cathode surface P. In FIG. 1B, an intersection point $O_1$ of the cathode surface P and the central axis 101 is also shown. As described above, a distance $r_i$ between the electron source $s_i$ and the intersection point $O_1$ on the cathode surface P depends on an inclination $\theta_i$ of the pulsed excitation light 12b with respect to the central axis 101. In the example in FIG. 1B, a focal point $s_i$ of the excitation light serving as the electron source does not include a point (intersection point $O_1$) on the central axis 101, but the focal point of the excitation light may be formed at a position of the point $O_1$.

FIG. 2A is a diagram showing a configuration example of the parallel light source 7 having an angle modulation mechanism. In the present configuration, excitation light from a plurality of light sources is output as parallel light by a collimator lens 21. An optical axis of the collimator lens 21 is the central axis 101 of the excitation light converging optical system. The parallel light source 7 includes a plurality of optical fibers 23-1 to 23-4, one ends of the optical fibers 23 are fixed by a bundle 22, and a plurality of corresponding laser light sources 24-1 to 24-4 are provided at the other ends of the plurality of optical fibers 23.

When fiber ends are provided on the optical axis of the collimator lens 21, the excitation light 12 (solid line) parallel to the central axis 101 (optical axis of the collimator lens 21) of the excitation light converging optical system is emitted. On the other hand, when the fiber end is not on the central axis 101 of the excitation light converging optical system, the excitation light 12b (broken line) inclined by an angle θ with respect to the excitation light 12 (solid line) is emitted. FIG. 2B shows the optical fibers 23-1 to 23-4 fixed by the bundle 22 as viewed from a collimator lens 21 side. In FIG. 2B, an intersection point $O_2$ of the bundle 22 and the central axis 101 is also shown. When the distance between the fiber end and the central axis is $r_s$ and the focal length of the collimator lens is $f_c$, the following relationship is satisfied.

$$r_s = f_c \cdot \tan \theta \quad \text{(Equation 2)}$$

Similarly, the distance $r_s$ can also be expressed as a vector $(r_{sx}, r_{sy})$ having an x-axis direction component and a y-axis direction component. It can be seen based on the Equations (1) and (2) that, by eliminating θ, the distance r $(=(r_x, r_y))$ between the electron source $s_i$ and the central axis $O_1$ of the excitation light converging optical system is determined according to $r_s(f/f_c)$ $(=(r_{sx}f/f_c, r_{sy}f/f_c))$.

The laser light source 24 is driven by a pulse power source 25 to generate pulse light. The pulse power source 25 is controlled according to a laser control signal 27 from a controller 26. FIG. 2C shows a time chart in which each of the laser light sources 24-1 to 24-4 emits light. A vertical axis represents a light intensity I generated by each laser light source 24, and a horizontal axis represents time t. The pulsed excitation light emitted by the laser light sources 24-1 to 24-4 is condensed at the positions of the electron sources $s_1$ to $s_4$ on the cathodes, respectively.

The laser light sources 24 emit the excitation light having a pulse width $t_p$ in a cycle of T seconds, and the timings at which the laser light sources 24 emit the excitation light are different from each other. As a result, the laser light source 24-1 corresponding to the electron source $s_1$, the laser light source 24-2 corresponding to the electron source $s_2$, the laser light source 24-3 corresponding to the electron source $s_3$, and the laser light source 24-4 corresponding to the electron source $s_4$ sequentially and repeatedly emit pulsed light in the cycle of T seconds. The timing at which the laser light source 24-$i$ emits light corresponds to the timing at which the electron source $s_i$ emits the pulsed electron beam 13, and the pulsed electron beams 13 emitted from the electron sources $s_i$ are controlled so as not to overlap with each other in time.

FIG. 3 shows a schematic configuration (first electron microscope configuration) of a scanning electron microscope using a photoexcited electron gun. The photoexcited electron gun 15 includes a vacuum vessel 9 and the excitation light converging optical system shown in FIG. 1A. In the vacuum vessel 9, a photocathode 1 is placed on a cathode holder 4 to which an acceleration voltage $-V_0$ is applied from an acceleration power supply 5 to an extraction electrode 3, and the pulsed electron beam 13 generated from the photocathode 1 enters an electron optical housing 16 through an opening portion 14 of the vacuum vessel 9 at an acceleration $V_0$. The excitation light 12 is taken into the vacuum vessel 9 through a window 6. In the electron optical housing 16, the pulsed electron beam 13 reduced by electron lenses such as a condenser lens 31, an electron lens 17, and an objective lens 29 is incident on a sample 20, and electrons generated therefrom are converted into an electric signal by an electron detector 19. A position of the pulsed electron beam 13 incident on the sample 20 is changed by a deflector 18, and an image forming unit (not shown) forms position information and a signal from the electron detector 19 as an image to obtain a scanning electron microscope image (SEM image).

FIG. 4A shows details of an electron optical system shown in FIG. 3. A trajectory 30 of the pulsed electron beam emitted from a focal point ($S_k$) of the excitation light formed at a position separated from the optical axis 34 of the electron optical system passes through the extraction electrode 3, advances in a direction of further separating from the optical axis 34, and is swung back by the condenser lens 31. In this state, a trajectory 30b (broken line) is taken, but the trajectory 30b is deflected by an aligner 8 and becomes a trajectory 30a that coincides with the optical axis 34. As shown in FIG. 2C, since different electron sources $S_i$ (i=1 to n) on the photocathode 1 emit electrons according to time, a deflection amount of the aligner 8 is controlled according to the electron source $S_i$ such that the pulsed electron beam emitted from the electron source $S_i$ forms the same trajectory 30a and irradiates the same position on the sample. Therefore, an aligner power supply 33 for controlling a deflection amount (including a direction and a magnitude of deflection) of the electron beam caused by the aligner 8 is controlled according to a deflection control signal 28 output from the controller 26 in synchronization with the laser control signal 27. As the aligner 8, an aligner that deflects an electron beam by a magnetic field, an aligner that deflects an electron beam by an electric field, or the like is used. When the pulse width of the pulsed electron beam or an interval until the next pulsed electron beam is emitted is short, a high-speed electrostatic aligner is suitable. As a result, as shown in FIG. 4B, the probe current $I_p$ of the pulsed electron beam 13 incident on the sample 20 is the sum of the probe currents $I_{p1}$ to $I_{p4}$ of the pulsed electron beams from the electron sources $s_1$ to $s_4$, and a substantial luminance is four times than that in the case of one pulsed electron beam. When the number of electron sources is two or more, an effect of increasing the luminance is attained. By increasing the number of the electron sources to, for example, 10 or 100, a further higher luminance can be achieved.

Although the aligner 8 has been described as an example in which the pulsed electron beam 13 is deflected in a manner of being aligned with the optical axis 34 of the electron optical system, since the same effect can be attained when viewed as one beam, a trajectory after the deflection may be inclined, and the trajectory after the deflection caused by the aligner 8 of the pulsed electron beam from the electron source $S_i$ (i=1 to n) may be the same.

Further, in order to align the trajectories of the pulsed electron beams from the electron sources $s_1$ to $s_4$, similar effect can be attained by superimposing a signal for correcting a trajectory difference due to a difference in the position of the electron source on a deflection signal for the deflector 18 (see FIG. 3) instead of the aligner 8. In this case, the deflection control signal 28 is input to the deflector 18 and includes correction information based on the position of the electron source and a magnification and a rotation angle of the electron optical system.

An optimal example of the excitation light converging optical system will be described. When an aspherical lens having a numerical aperture (NA) of 0.5 and a focal length f of 4.2, which is optimized when the transparent substrate 11 is made of glass or the like having a thickness of 1.2 mm and a refractive index of approximately 1.5, is used as the condenser lens 2, the excitation light condensed on the photocathode 1 is narrowed down to the diffraction limit at a wavelength of the excitation light at a position within approximately 80 μm from an axial center. Therefore, in order to attain a high luminance, the electron source $s_i$ may be formed in a region within 80 μm from the central axis. Therefore, the inclination θ of the excitation light is selected to be within 17 mrad from the central axis. In order to attain a high luminance, it is desirable to use the condenser lens 2 having a large numerical aperture, for example, an NA of 0.4 or more. In particular, since an aspherical lens satisfying the above specifications is used as a pickup for an optical recording medium, the aspherical lens has an advantage of being available at low cost.

The focal length $f_c$ of the collimator lens is not limited in principle, but is selected in the range of 40 mm to 20 mm since the intensity of the excitation light incident on the photocathode is low when the focal length $f_c$ is too large and the interval between the fibers cannot be reduced when the focal length $f_c$ is too small.

As the photoelectric film 10, a work function lowering film mainly formed of Cs is provided on a surface, a photoelectric film mainly formed of p-type GaAs is used, and an electron source using negative electron affinity (NEA) is formed. According to the study of the inventors, when such a photoelectric film is continuously irradiated with continuously oscillated excitation light, the maximum luminance of an electron source is approximately $1 \times 10^7$ A/sr/m²/V. This value is equivalent to that of an Schottky emission (SE) electron source used by heating Zr—O/W used in a high-resolution electron microscope. On the other hand, a cold field emission (CFE) electron source having a higher luminance is used in an electron microscope having the highest resolution, and the CFE electron source has a luminance approximately 10 times as high as that of the SE electron source. Therefore, if an electron source having at least the same luminance cannot be achieved, an electron microscope having the highest resolution using an NEA electron source cannot be achieved.

It has been found that when the NEA electron source is irradiated with pulsed excitation light having a pulse width of approximately 10n seconds instead of continuously oscillated excitation light, a luminance equivalent to that of the CFE electron source or higher than that of the CFE electron source is instantaneously attained. However, in order to use the electron source of the electron microscope, it is necessary that the probe current amount $I_p$ obtained by time-averaging becomes a sufficient value. Therefore, when the photoelectric film 10 is continuously irradiated with the pulsed excitation light, the expected probe current amount is not obtained from a luminance value when single pulsed excitation light is emitted. That is, it has been found that the characteristics of the electron source obtained by continuous irradiation with the pulsed excitation light are close to the characteristics of the electron source obtained by irradiation with the continuously oscillated excitation light. Therefore, it is concluded that, even when the pulse excitation light is used in one NEA electron source, increasing of the luminance cannot be achieved by time averaging. The configuration according to the present embodiment has been conceived in which a plurality of NEA electron sources are formed in one photocathode. In the case of the NEA electron source, since the focal point of the excitation light on the photocathode is an electron source, it is possible to form a plurality of NEA electron sources that instantaneously generate an electron beam having a high luminance by pulse excitation light at different places, and it is possible to use the NEA electron sources as a high-luminance electron source of an electron optical system by generating the electron beam by time division such that probe currents from the NEA electron sources do not overlap. By increasing the luminance of the electron source of the electron optical system, the resolution of the electron microscope can be further increased, and by increasing the probe current, the measurement time can be shortened. By increasing the number of the electron sources to be time-divided to, for example, 10 or 100, it becomes easier to further increase the luminance.

As an angle modulation mechanism of the parallel light source 7, in addition to using the plurality of laser light sources shown in FIG. 2A, as shown in FIG. 5, one pulse parallel light source 50 and a movable mirror 51 may be used. If the movable mirror includes two movable mirrors for x and y, a moving mechanism of the movable mirror can have a simple structure, and the NEA electron source can be disposed at any position on an x-y plane of the photocathode 1. In addition to the movable mirror 51, a spatial light modulator such as a liquid crystal element, a micro mirror, an electro-optical element, or an elastic element can be used to modulate the angle of the parallel light.

Instead of the photocathode 1 using glass having a thickness of 1.2 mm for the transparent substrate 11, as shown in FIG. 6, the photocathode 1 using a single crystal semiconductor transparent substrate 60 is used as a photocathode having a higher luminance. On the other hand, when the aspheric lens described above is used as the condenser lens 2 as it is, a spherical aberration compensation plate 61 is provided between the condenser lens 2 and the photocathode 1. The refractive index and the thickness of the spherical aberration compensation plate 61 are determined such that the excitation light passes through the single crystal semiconductor transparent substrate 60 and forms a focal point having a small diffraction limit on the photoelectric film 10.

In the electron optical system in FIG. 4, while the trajectory is controlled such that the pulsed electron beams from the plurality of NEA electron sources are emitted onto one point of the sample 20, the sample 20 may be irradiated without such trajectory control. In this case, the pulsed electron beams from the NEA electron sources are emitted to different positions depending on the positions of the electron sources. The configuration (second electron microscope configuration) of the scanning electron microscope in this case is similar as that in FIG. 3, and the deflection control signal 28 to the aligner 8 or the deflector 18 for controlling the trajectory of the electron beam is not necessary. However, as will be described later, depending on the spatial resolution of the scanning electron microscope, it is necessary to discriminate the detection signal according to the electron source at the time of image formation, and thus the controller 26 outputs a discrimination signal 28b in synchronization with the laser control signal 27.

As shown in FIG. 7A, when trajectory control of the pulsed electron beam is not executed, the pulsed electron beams from the electron sources $s_1$ to $s_4$ are incident on positions $p_1$ to $p_4$ of the sample 20 in a time-divided manner. FIG. 7A shows a state in which the pulsed electron beam 13-1 from the electron source $s_1$ is incident on the position $p_1$ of the sample 20. Electrons 73 generated from a sample surface by the incidence of the pulsed electron beam are detected by the electron detector 19.

As shown in FIG. 7B, the pulsed electron beam 13 is deflection-controlled on the x-y plane of the surface of the sample 20 by the deflector 18. For example, the deflector 18 scans the two-dimensional measurement region according to a method (step and repeat method) in which an electron trajectory 72 of the pulsed electron beam is first swept in an x direction, then is moved to a position shifted by a predetermined distance in a y direction, and is swept again in the x direction. FIG. 7C shows a relationship between the scanning direction and the positions $p_1$ to $p_4$ irradiated with the pulsed electron beams from the electron sources $s_1$ to $s_4$. The positions $p_1$ to $p_4$ are arranged such that distances L in the y direction between adjacent ones of trajectories 74 at the positions $p_1$ to $p_4$ when the electron trajectory 72 is swept in the x direction are equal to each other. When the angle modulation mechanism of the parallel light source 7 is fixed, projection images of the electron sources $s_1$ to $s_4$ can be adjusted by rotating the projection images around the optical axis of the electron optical system by the lens of the electron optical system. In the angle modulation mechanism of the excitation light shown in FIG. 2A, an interval between the electron sources is fixed by the optical fiber 23 fixed by the bundle 22 and the collimator lens 21. However, for example, the position of the fiber end may be variable, and a position of the focal point (electron source) on the photoelectric film 10 may be variable. The positions $p_1$ to $p_4$ can be determined by calculation according to the position of the fiber end based on optical conditions of the excitation light converging optical system and the electron optical system. Further, in the case of performing positioning with high accuracy, the positions $p_1$ to $p_4$ irradiated with the pulsed electron beam may be calibrated using a configuration sample provided with a predetermined pattern.

FIG. 7D shows a magnitude of a detection signal s p output by the electron detector 19 detecting electrons generated by irradiating the sample 20 with the pulsed electron beam 13 from the electron sources $s_1$ to $s_4$. Detection signals $s_p$ having different intensities are output according to a state (a shape, a composition, and the like) of the sample 20 at the position irradiated with the pulsed electron beam 13.

Here, when the interval between the positions $p_1$ to $p_4$ shown in FIG. 7A is sufficiently smaller than the desired spatial resolution, it is not necessary to discriminate the detection signals from the positions, and an SEM image may be formed by regarding the detection signals from the positions as detection signals from the same position. For example, it is assumed that the electron sources $S_1$ to $S_4$ on the photoelectric film 10 are separated from one another by 100 μm at the maximum, and a reduction ratio of the electron optical system is 1/1000. In this case, the positions $p_1$ to $p_4$ are separated from one another by 100 nm at the maximum (in the example in FIG. 7C, the distance 3L, which is an interval between a trajectory 74-1 and a trajectory 74-4, is the maximum distance). Therefore, when the desired spatial resolution is larger than 100 nm, the pulsed electron beams having different irradiation positions can be treated as one beam.

On the other hand, in the above-described example, when the desired spatial resolution is 100 nm or less, the detection signals when the pulsed electron beams from the electron sources $s_1$ to $s_4$ are emitted are independently handled as the detection signals from the positions $p_1$ to $p_4$, respectively. Therefore, in the configuration in FIG. 7A, a preamplifier 71 that amplifies the detection signal from the electron detector 19 and a detection signal discrimination unit 70 that discriminates the amplified detection signal are provided. The detection signal discrimination unit 70 discriminates, based on the discrimination signal 28b from the controller 26, from which electron source the pulsed electron beam is emitted to obtain the detection signal output from the preamplifier 71. Here, although an example has been shown in which the detection signal is discriminated by the switch according to the discrimination signal 28b, a configuration may be adopted in which the detection signal is converted into a digital signal and then discriminated by signal processing.

The image forming unit forms an image using the detection signal discriminated in this manner as the detection signal at a different position on the sample, so that a high-resolution image equivalent to the first electron microscope configuration can be obtained. This is because, in the case of the second electron microscope configuration, if a sweep speed is set to ¼ of the sweep speed in the first electron microscope configuration that controls the trajectory of the pulsed electron beam, as shown in FIG. 7C, four pulsed electron beams are swept at one time, and thus a total probe current amount for obtaining one SEM image is the same.

As a more positive application of the second electron microscope configuration, in a case in which a point to be measured on a sample is limited, when a position $p_i$ (i=1 to n) is determined to be at the point and a pulse electron beam is emitted, extremely high-speed measurement becomes possible.

While the invention made by the present inventor has been specifically described based on the embodiments, the invention is not limited thereto, and various modifications may be made without departing from the scope of the invention. For example, although the scanning electron microscope has been described as an example of the electron microscope, the invention can be applied to various electron beam application apparatuses such as a transmission electron microscope and a scanning electron microscope. The electron beam application apparatus is not limited to an electron beam application apparatus including an electron detector that detects electrons (secondary electrons, reflected electrons, and the like) generated by irradiation with an electron beam, and may include another detector such as a detector that detects characteristic X-rays.

REFERENCE SIGN LIST 1 photocathode
2 condenser lens
3 extraction electrode
4 cathode holder
5 acceleration power supply
6 window
7 parallel light source
8 aligner
9 vacuum vessel
10 photoelectric film
11 transparent substrate
12 excitation light
13 pulsed electron beam
14 opening portion
15 photoexcited electron gun
16 electron optical housing
17 electron lens
18 deflector
19 electron detector
20 sample
21 collimator lens
22 bundle
23 optical fiber
24 laser light source
25 pulse power source
26 controller
27 laser control signal
28 deflection control signal
28b discrimination signal
29 objective lens
30 trajectory
31 condenser lens
33 aligner power supply
34 optical axis
50 pulse parallel light source
51 movable mirror
60 single crystal semiconductor transparent substrate
61 spherical aberration compensation plate
70 detection signal discrimination unit
71 preamplifier
72 electron trajectory
73 electron
74 trajectory
101 central axis

The invention claimed is:

1. An electron gun comprising:
a photocathode including a substrate and a photoelectric film;
a light source that emits a plurality of pulsed excitation lights;
a condenser lens that focuses each of the pulsed excitation lights toward the photocathode; and
an extractor electrode that faces the photocathode and that accelerates an electron beam generated from the photoelectric film by focusing each of the pulsed excitation lights by the condenser lens, transmitting each of the pulsed excitation lights through the substrate of the photocathode, and causing each of the pulsed excitation lights to be incident on the photocathode, wherein
each of the pulsed excitation lights is condensed at a different timing at a different position on the photoelectric film of the photocathode,
each of the plurality of pulsed excitation lights is condensed at one of a plurality of positions on the photoelectric film of the photocathode in a timing sequence according to a predetermined repeated cycle, and
a timing of each of the pulsed excitation lights condensed at the plurality of positions is controlled so as to not overlap with one another.

2. The electron gun according to claim 1, wherein the light source includes an angle modulation mechanism that changes an emission angle of the pulsed excitation lights.

3. The electron gun according to claim 2, wherein the angle modulation mechanism includes a pulse parallel light source and a spatial light modulator, and
each of the pulsed excitation lights from the pulse parallel light source is modulated by the spatial light modulator, and is emitted to the plurality of positions on the photoelectric film of the photocathode.

4. The electron gun according to claim 1, further comprising:
a spherical aberration compensation plate disposed between the condenser lens and the photocathode, wherein
in an excitation light converging optical system including the light source, the spherical aberration compensation plate, and the condenser lens, a refractive index and a thickness of the spherical aberration compensation plate are determined such that each of the pulsed excitation lights condensed at each of the plurality of positions is narrowed down to a diffraction limit at a wavelength of the pulsed excitation light.

5. An electron gun comprising:
a photocathode including a substrate and a photoelectric film;
a light source that emits pulsed excitation light;
a condenser lens that focuses the pulsed excitation light toward the photocathode; and
an extractor electrode that faces the photocathode and that accelerates an electron beam generated from the photoelectric film by focusing the pulsed excitation light by the condenser lens, transmitting the pulsed excitation light through the substrate of the photocathode, and causing the pulsed excitation light to be incident on the photocathode, wherein
the pulsed excitation light is condensed at different timings at different positions on the photoelectric film of the photocathode,
the pulsed excitation light is condensed at a plurality of positions on the photoelectric film of the photocathode at a predetermined cycle, and timings of the pulsed excitation light condensed at the plurality of positions are different from each other,
the light source includes an angle modulation mechanism that changes an emission angle of the pulsed excitation light, and
the angle modulation mechanism includes a plurality of laser light sources, a plurality of optical fibers each having one of the plurality of laser light sources provided at a same end thereof, a collimator lens facing the other ends of the plurality of optical fibers, and a pulse power source that drives any one of the plurality of laser light sources.

6. The electron gun according to claim 5, wherein
in an excitation light converging optical system including the light source and the condenser lens, the plurality of positions on the photoelectric film of the photocathode are set at a distance from a central axis of the excitation light converging optical system such that the pulsed excitation light condensed at each of the plurality of positions is narrowed down to a diffraction limit at a wavelength of the pulsed excitation light.

7. An electron beam application apparatus comprising:
a photoexcited electron gun including an excitation light converging optical system and a photocathode, the excitation light converging optical system including a light source and a condenser lens;
an electron optical system including a deflector that two-dimensionally scans a sample with a pulsed electron beam from the photoexcited electron gun; and a control unit that controls the excitation light converging optical system to emit the pulsed electron beam from different positions on the photocathode at different timings, wherein
the control unit outputs a deflection control signal for controlling a trajectory of the pulsed electron beam in synchronization with a control signal for controlling emission of the pulsed electron beam such that the pulsed electron beam emitted from a different position on the photocathode is emitted to the same position on the sample.

8. The electron beam application apparatus according to claim 7, wherein
the electron optical system includes an aligner that deflects the pulsed electron beam, and
the aligner deflects the pulsed electron beam according to the deflection control signal.

9. An electron beam application apparatus comprising:
a photoexcited electron gun including an excitation light converging optical system and a photocathode, the excitation light converging optical system including a light source and a condenser lens;
an electron optical system including a deflector that two-dimensionally scans a sample with a pulsed electron beam from the photoexcited electron gun;
a detector that detects electrons generated by the sample being irradiated with the pulsed electron beam and that outputs a detection signal; and
a control unit that controls the excitation light converging optical system to emit the pulsed electron beam from a plurality of positions on the photocathode at different timings, wherein
the control unit outputs a discrimination signal synchronized with a control signal for controlling emission of the pulsed electron beam, and is capable of discriminating, based on the discrimination signal, which position among the plurality of positions on the photocathode the pulsed electron beam is emitted to the sample from, in order to detect the detection signal output from the detector.

10. The electron beam application apparatus according to claim 9, wherein
an image forming unit configured to form an image using a detection signal discriminated according to the discrimination signal as a detection signal at a different position on the sample.

11. The electron beam application apparatus according to claim 9, wherein
the plurality of pulsed electron beams emitted from the plurality of positions of on the photocathode are swept in a first direction by the deflector to draw a trajectory extending in the first direction, and positions at which the plurality of pulsed electron beams are emitted to the sample are adjusted such that distances between the adjacent trajectories are equal to each other.

* * * * *